United States Patent
Yuan et al.

(10) Patent No.: US 7,718,559 B2
(45) Date of Patent: May 18, 2010

(54) EROSION RESISTANCE ENHANCED QUARTZ USED IN PLASMA ETCH CHAMBER

(75) Inventors: Jie Yuan, San Jose, CA (US); Jennifer Y. Sun, Sunnyvale, CA (US); Renguan Duan, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 306 days.

(21) Appl. No.: 11/738,030

(22) Filed: Apr. 20, 2007

(65) Prior Publication Data

US 2008/0261800 A1 Oct. 23, 2008

(51) Int. Cl.
*C03C 3/06* (2006.01)
*C03C 3/04* (2006.01)
(52) U.S. Cl. .............................. 501/54; 501/53; 156/915
(58) Field of Classification Search ................... 501/54, 501/53; 156/915, 345.51, 345.14
See application file for complete search history.

(56) References Cited

U.S. PATENT DOCUMENTS

| | | | |
|---|---|---|---|
| 4,742,307 A | 5/1988 | Thylen et al. | |
| 5,292,399 A | 3/1994 | Lee et al. | |
| 5,977,000 A * | 11/1999 | Sato et al. | 501/39 |
| 6,136,736 A * | 10/2000 | Rajaram et al. | 501/54 |
| 6,641,697 B2 | 11/2003 | Han et al. | |
| 7,365,037 B2 * | 4/2008 | Sato et al. | 501/54 |
| 2002/0076559 A1 * | 6/2002 | Sato et al. | 428/426 |
| 2004/0002221 A1 | 1/2004 | O'Donnell et al. | |
| 2004/0041004 A1 | 3/2004 | Thach et al. | |
| 2004/0191545 A1 | 9/2004 | Han et al. | |
| 2005/0005859 A1 * | 1/2005 | Koshiishi et al. | 118/728 |
| 2005/0016684 A1 | 1/2005 | Sun et al. | |
| 2005/0056218 A1 | 3/2005 | Sun et al. | |
| 2005/0120945 A1 | 6/2005 | Hansen | |
| 2005/0272588 A1 * | 12/2005 | Sato et al. | 501/54 |
| 2005/0274321 A1 | 12/2005 | Ukei et al. | |
| 2005/0279457 A1 | 12/2005 | Matsudo et al. | |
| 2006/0046450 A1 | 3/2006 | Narendar et al. | |
| 2008/0113174 A1 * | 5/2008 | Sato et al. | 428/220 |
| 2009/0163344 A1 * | 6/2009 | Weber et al. | 501/53 |

FOREIGN PATENT DOCUMENTS

WO   WO-2006/108766   10/2006

OTHER PUBLICATIONS

PCT Search Report and Written Opinion for PCT/US2008/060436, Aug. 14, 2008, copy consists of 10 unnumbered pages.

* cited by examiner

*Primary Examiner*—Karl E Group
*Assistant Examiner*—Noah S Wiese
(74) *Attorney, Agent, or Firm*—Patterson & Sheridan, LLP

(57) ABSTRACT

A method of fabricating doped quartz component is provided herein. In one embodiment, the doped quartz component is a yttrium doped quartz ring configured to support a substrate. In another embodiment, the doped quartz component is a yttrium and aluminum doped cover ring. In yet another embodiment, the doped quartz component is a yttrium, aluminum and nitrogen containing cover ring.

12 Claims, 5 Drawing Sheets

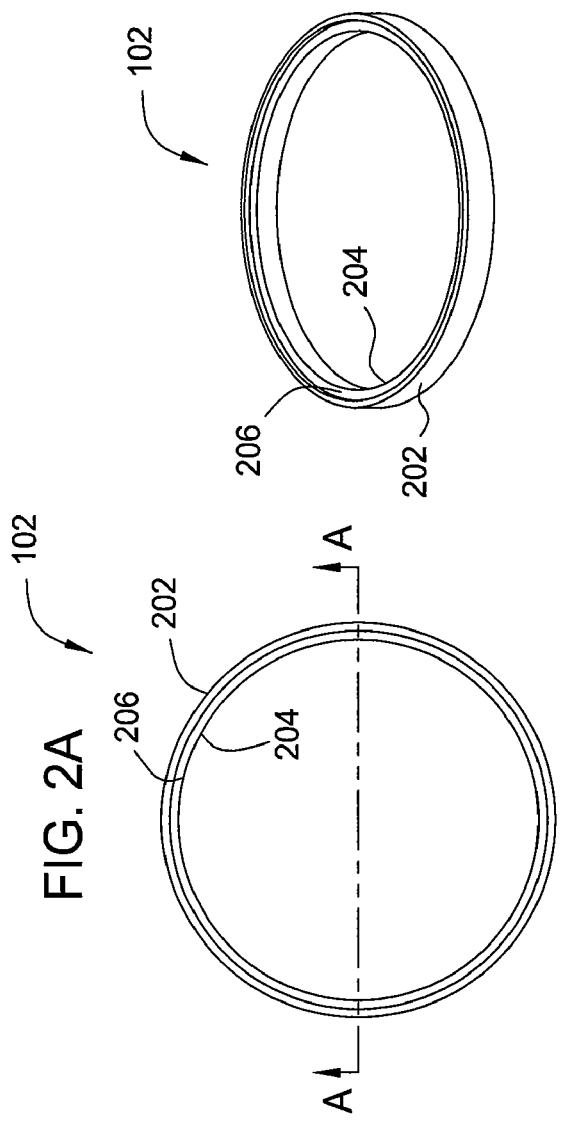
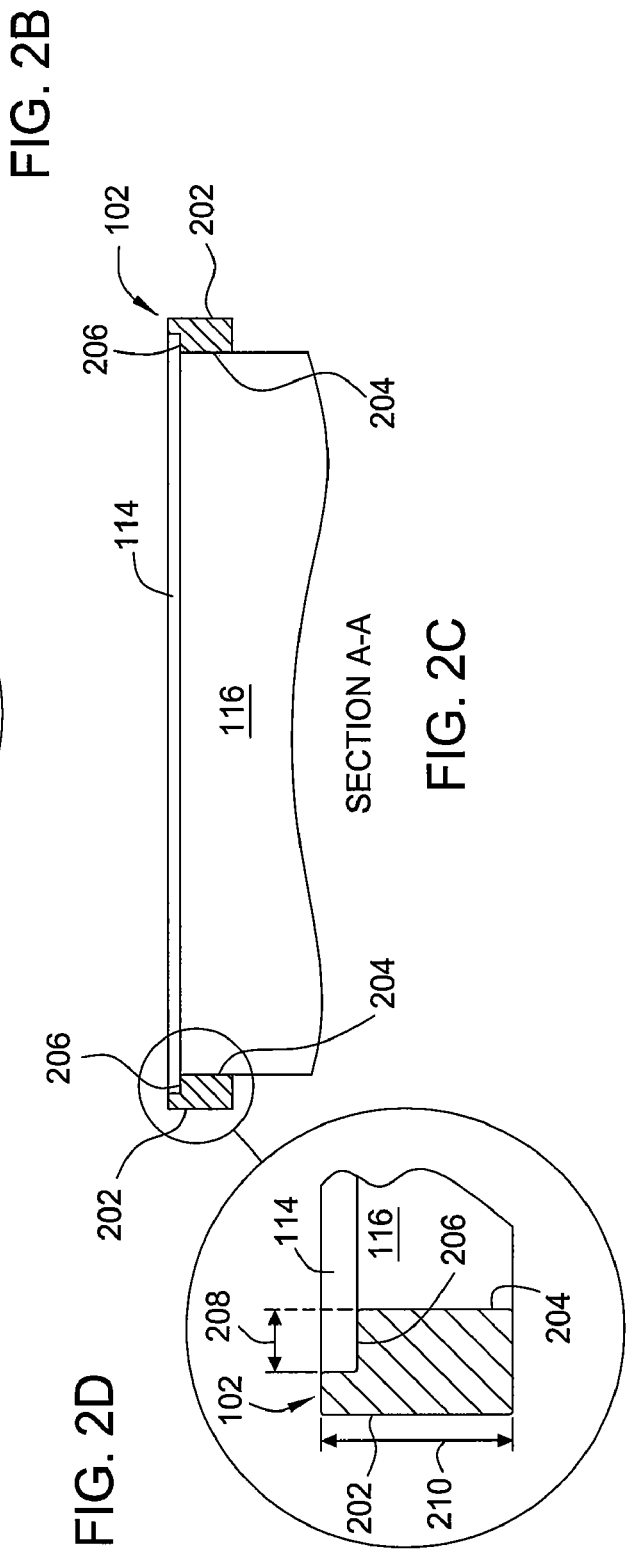

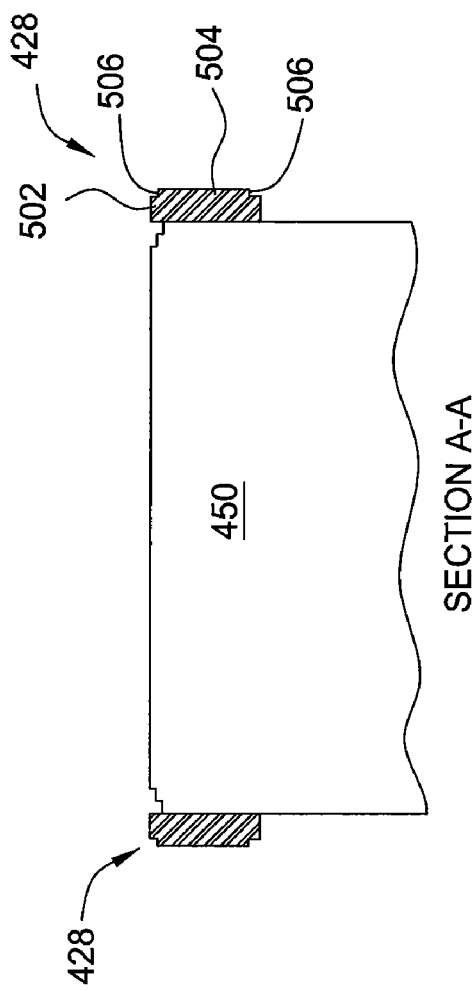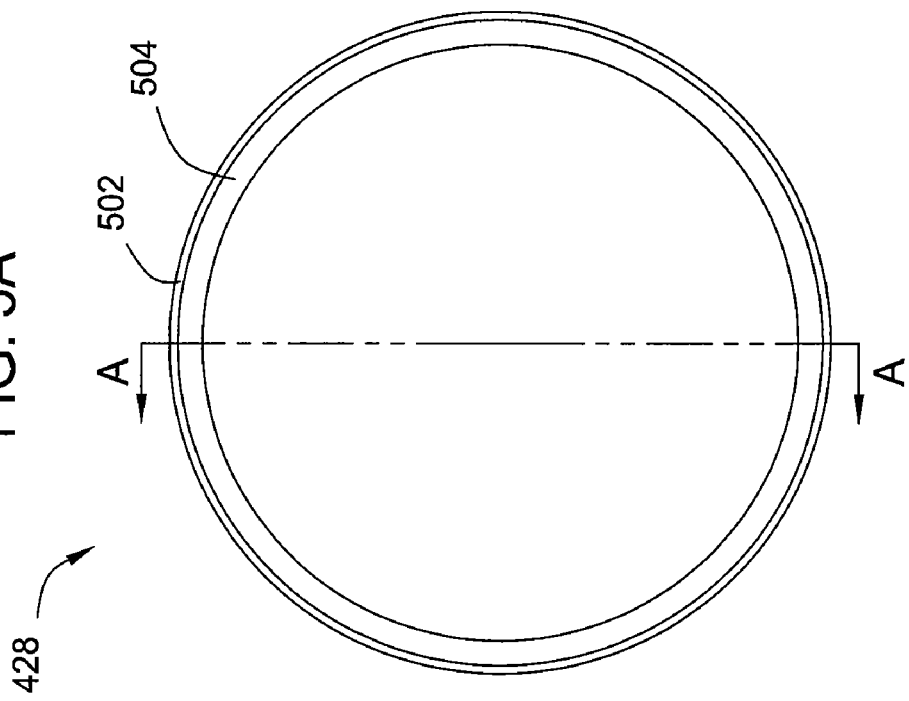

EROSION RESISTANCE ENHANCED QUARTZ USED IN PLASMA ETCH CHAMBER

BACKGROUND

1. Field

Embodiments of the present invention generally relate to a plasma resistive chamber component and a method for fabricating the same.

2. Description of the Related Art

Semiconductor processing involves a number of different chemical and physical processes whereby minute integrated circuits are created on a substrate. Layers of materials which make up the integrated circuit are created by numerous plasma processes, such as chemical vapor deposition, physical vapor deposition and the like. Some of the layers of material are patterned using photoresist masks and wet or dry plasma etching techniques. The substrate utilized to form integrated circuits may be silicon, gallium arsenide, indium phosphate, glass, or other appropriate material.

During plasma processing, the energized gas is often comprised of highly corrosive species which etches and erodes exposed portions of the chamber and components positioned therein. The eroded chamber components must be replaced after a number of process cycles before it contributes to inconsistent or undesirable processing results. Additionally, particles eroded from the chamber component may contaminate substrates processed within the chamber, thereby resulting in processing defects.

Thus, there is a need for chamber components with enhanced plasma resistance.

SUMMARY

Embodiments of the invention provide methods of fabricating a doped quartz component with good plasma resistance. In one embodiment, a doped quartz component for use in a plasma chamber may include a yttrium doped quartz ring configured to support a substrate.

In another embodiment, the doped quartz component for use in a plasma chamber may include a quartz ring having an annular body adapted to circumscribe a substrate support pedestal and comprised of a material suitable for exposure to a corrosive plasma environment, wherein the quartz ring comprises yttrium and aluminum dopants less than about 5 percent by weight respectively.

In yet another embodiment, a plasma process chamber may include a chamber body having an interior volume, a support pedestal disposed in the chamber body and adapted to receive a substrate thereon, and a plasma resistive yttrium doped quartz component having at least one surface exposed to the interior volume.

In still another embodiment, a method for manufacturing a yttrium containing quartz component may include blending quartz material with a yttrium containing material to form a mixture, heating the mixture, and forming a yttrium containing quartz component, wherein the yttrium containing quartz component having an annular body adapted to circumscribe a substrate support pedestal.

BRIEF DESCRIPTION OF THE DRAWINGS

So that the manner in which the above-recited features of the present invention can be understood in detail, a more particular description of the invention, briefly summarized above, may be had by reference to embodiments, some of which are illustrated in the appended drawings.

FIG. 2A depicts a top view of one embodiment of an exemplary cover ring suitable for use in the chamber of FIG. 1;

FIG. 2B is bottom view of the cover ring of FIG. 2A;

FIG. 2C depicts a schematic cross-sectional view of the cover ring of FIG. 2A disposed on a substrate support assembly;

FIG. 2D depicts an enlarged view of the schematic cross-sectional view of FIG. 2C;

FIG. 5A depicts a top view of another embodiment of an exemplary cover ring suitable for use in the chamber of FIG. 1; and FIG. 5B depicts a schematic cross-sectional view along a cutaway ling A-A of the cover ring of FIG. 5A.

Figure 1:
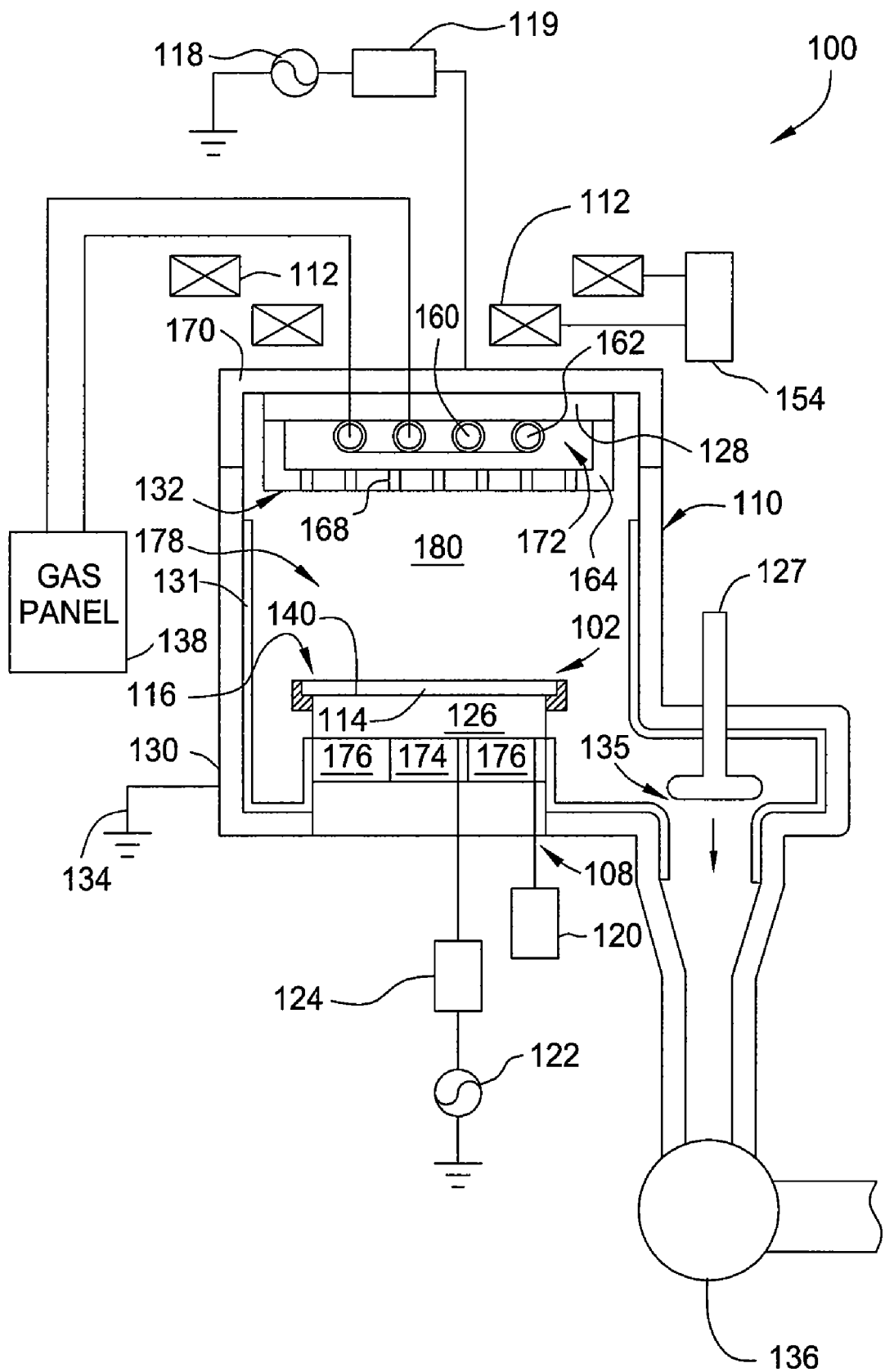
FIG. 1 depicts a schematic diagram of one embodiment of an exemplary plasma etch chamber that may benefit from embodiments of the invention.

It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present invention provide chamber components with enhanced plasma corrosion resistance and methods of manufacturing the same. In one embodiment, the chamber component is a cover ring adapted to engage a substrate disposed on a substrate support pedestal. It is contemplated that other chamber components may include shields, windows, lids, rings and the like. In another embodiment, the cover ring is a yttrium doped quartz ring. In another embodiment, the cover ring is a yttrium and aluminum doped ring. In yet another embodiment, the cover ring is a yttrium, aluminum and nitrogen containing ring. The cover ring may be fabricated from a quartz material doped with yttrium (Y) element. As used herein, a yttrium (Y) element may be yttrium and/or a yttrium containing material, such as yttrium (Y) metal, yttrium oxide ($Y_2O_3$), yttrium alloy and the like. The yttrium doped quartz ring may also include aluminum (Al) metal, aluminum oxide ($Al_2O_3$), aluminum alloy, aluminum nitrogen (AlN), nitrogen element or deviations thereof. Furthermore, the chamber component may be an insulator ring used alone or in combination with the cover ring to circumscribe a substrate support pedestal. The doped quartz material provides enhanced corrosion resistance, suitable for use in components exposed to a corrosive plasma environment, thereby improving the service lifetime of the chamber component, while reducing maintenance and manufacturing cost.

FIG. 1 depicts a schematic, cross-sectional diagram of one embodiment of an exemplary plasma processing chamber 100 that can benefit from embodiments of this invention. The embodiment of the chamber shown herein is provided for illustrative purposes and should not be used to limit the scope of the invention. Chamber components used in the plasma processing chamber 100 may have yttrium (Y) doping to enhance corrosion resistance while exposed to plasma.

Embodiments of this invention can be used to fabricate yttrium (Y) doped chamber components for a variety of applications. The improved chamber components are also suitable for use in corrosive environments such as those encountered in plasma processes. A variety of plasma processing chambers may benefit from having yttrium (Y) doped components including etch chambers, PVD chambers, plasma and annealing chambers, plasma treating chambers, plasma enhanced CVD chambers, and ion implantation chambers, among others.

The chamber 100 comprises a vacuum chamber body 110 having a conductive chamber wall 130 and bottom 108. The chamber wall 130 is connected to an electrical ground 134. A lid 170 is disposed on the chamber wall 130 to enclose an interior volume 178 defined within the chamber body 110. At least one solenoid segment 112 is positioned exterior to the chamber wall 130. The solenoid segment(s) 112 may be selectively energized by a DC power source 154 that is capable of producing at least 5V to provide a control knob for plasma processes formed within the processing chamber 100.

A liner 131 is disposed within the interior volume 178 to facilitate cleaning of the chamber 100. The byproducts and residue of the etch process may be readily removed from the liner 131 at selected intervals.

A substrate support pedestal 116 is disposed on the bottom 108 of the process chamber 100 below the gas diffuser 132. A process region 180 is defined within the interior volume 178 between the substrate support pedestal 116 and a diffuser 132. The substrate support pedestal 116 may include an electrostatic chuck 126 for retaining a substrate 114 on a surface 140 of the pedestal 116 beneath the gas diffuser 132 during processing. The electrostatic chuck 126 is controlled by a DC power supply 120.

In one embodiment, a cover ring 102 is disposed around an outer perimeter of the pedestal 116 as well as the substrate 114. In one embodiment, the cover ring 102 is comprised of a quartz material having yttrium (Y) element doped therein. In one embodiment, the cover ring 102 may be fabricated according to embodiments of a method described below. The yttrium doped cover ring 102 exhibits improved corrosion resistance compared to other parts fabricated using conventional processes, and as such, protect the pedestal 116 from damage during substrate processing. Additional details about the cover ring 102 will be discussed below in connection with FIGS. 2A-D.

The support pedestal 116 may be coupled to an RF bias source 122 through a matching network 124. The bias source 122 is generally capable of producing an RF signal having a tunable frequency of 2 kHz to 13.56 MHz and a power of between 0 and 5000 Watts. Optionally, the bias source 122 may be a DC or pulsed DC source.

The support pedestal 116 may also include inner and outer temperature regulating zones 174, 176. Each zone 174, 176 may include at least one temperature regulating device, such as a resistive heater or a conduit for circulating coolant, so that the radial temperature gradient of the substrate disposed on the pedestal may be controlled.

The interior of the chamber 100 is a high vacuum vessel that is coupled to a vacuum pump 136 through an exhaust port 135 formed through the chamber wall 130 and/or chamber bottom 108. A throttle valve 127 disposed in the exhaust port 135 is used in conjunction with the vacuum pump 136 to control the pressure inside the processing chamber 100. The position of the exhaust port 135 and other flow restrictions within the interior volume 178 of the chamber body 110 greatly influence the conductance and gas flow distribution within the processing chamber 102.

The gas diffuser 132 provides a conduit through which at least one process gas is introduced into the processing region 180. In one embodiment, the gas diffuser 132 may provide process gases to the region 180 in an asymmetrical manner that may be used to tune the conductance and gas flow distribution described above that are caused by the other chamber components (i.e., location of the exhaust port, geometry of the substrate support pedestal or other chamber component) so that the flow of gases and species are delivered to the substrate in a uniform, or selected, distribution.

In one embodiment illustratively depicted in FIG. 1, the gas diffuser 132 includes at least two gas distributors 160, 162, a mounting plate 128 and a gas distribution plate 164. The gas distributors 160, 162 are coupled to one or more gas panels 138 through the lid 170 of the processing chamber 100, and are also coupled to at least one of the mounting or gas distribution plates 128, 164. The flow of gas through the gas distributors 160, 162 may be independently controlled. Although the gas distributors 160, 162 are shown coupled to a single gas panel 138, it is contemplated that the gas distributors 160, 162 may be coupled to one or more shared and/or separate gas sources. Gases provided from the gas panel 138 are delivered into a region 172 defined between the plates 128, 164, then exit through a plurality of apertures 168 formed through the gas distribution plate 164 into the processing region 180.

The mounting plate 128 is coupled to the lid 170 opposite the support pedestal 116. The mounting plate 128, which is fabricated from or covered by an RF conductive material, is coupled to an RF source 118 through an impedance transformer 119 (e.g., a quarter wavelength matching stub). The source 118 is generally capable of producing an RF signal having a tunable frequency between about 60 MHz and about 162 MHz and a power between about 0 and 3000 Watts. The mounting plate 128 and/or gas distribution plate 164 is powered by the RF source 118 to maintain a plasma formed from the process gases in the process region 180.

FIGS. 2A-D are schematic illustrations of one embodiment of the cover ring 102. FIGS. 2A-B depict a plan and a side view of the cover ring 102. The cover ring 102 has an outer perimeter 202 and an inner perimeter 204. In one embodiment, the cover ring 102 has an inner diameter of about 12 inches and an outer diameter of about 14 inches. A recessed portion 206 is formed adjacent the inner perimeter 204. FIG. 2C depicts a cross-sectional view of FIG. 2A taken along section line A-A disposed around pedestal 116 and substrate 114. The recessed portion 206 formed adjacent the inner perimeter 204 is sized accordingly to accommodate the substrate 114. FIG. 2D depicts an enlarged view of a side of the cover ring 102 disposed on the pedestal 116 and substrate 114. The recessed portion 206 of the cover ring 102 has a length between about 0.8 inches. The cover ring 102 has a height about 1.2 inches circumscribing the pedestal 116.

In one embodiment, the cover ring 102 is a yttrium doped quartz ring. In another embodiment, the cover ring 102 is a yttrium and aluminum doped ring. In yet another embodiment, the cover ring is a yttrium, aluminum and nitrogen containing ring. The cover ring 102 can be attached to the pedestal 116 by a variety of methods known to one skilled in the art. By providing the cover ring 102 in close proximity to, and surrounding the substrate 114, e.g., a silicon wafer, process uniformity such as center to edge uniformity may be improved. Such improvement is believed to result from the plasma or electrical environment near the substrate 114 being modified by the cover ring 102.

Figure 3:
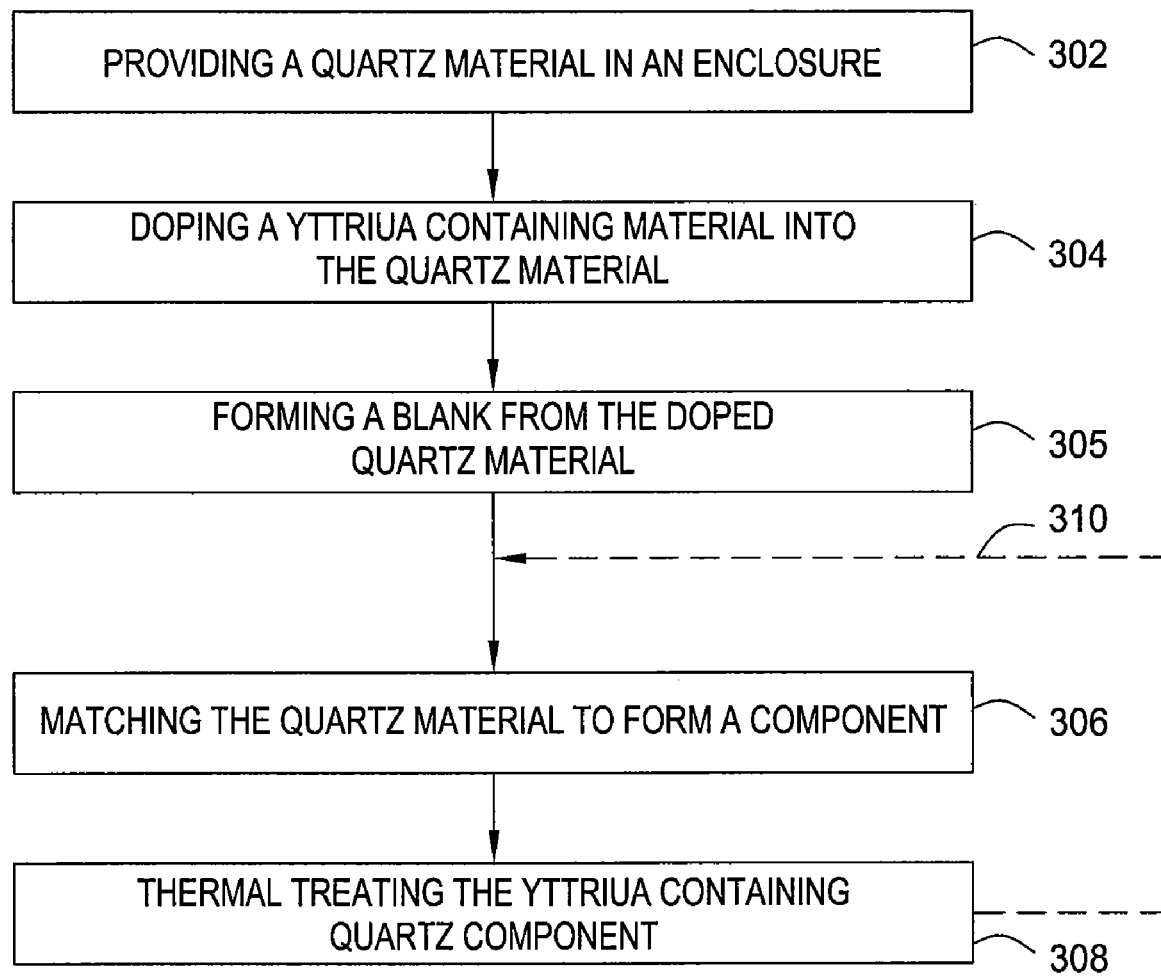
FIG. 3 depicts a process flow of a method for manufacturing a chamber component.

FIG. 3 depicts an embodiment of a method for manufacturing a cover ring, such as the cover ring 102 of FIG. 1. The method 300 may be used to fabricate other yttrium doped chamber components, such as shields, windows, lids, rings and the like. The method 300 begins at box 302 by providing a quartz material in an enclosure, such as a furnace, a canister, a mixer, or a chamber. The quartz material may be selected from a group comprising of glass, synthetic silica, fused silica, fused quartz, high purity quartz, quartz sand and other suitable silicon containing material suitable for forming a quartz glass composition. The quartz material may be also obtained by any suitable process.

In box 304, a dopant source, such as a yttrium (Y) element and/or aluminum (Al) element, is added and mixed with the quartz material to form a yttrium and/or aluminum (Al) element containing quartz composition. The dopant source may be in form of particles having a diameter between about 0.01 µm and about 0.02 µm.

In one embodiment of a mixing procedure, the quartz material may be heated into a predetermined temperature, such as greater than about 1000 degrees Celsius, to fuse the quartz material in a liquid and/or gel form. Subsequently, the dopant source is added and blended into the fused quartz material to form a mixture having a desired dopant concentration. Alternatively, in embodiments where the quartz material is in solid form, such as quartz sand, the dopant source is blended and tumbled with the solid quartz material to form a dopant mixture. Subsequently, the dopant mixture is heated into a predetermined temperature, such as greater than about 1000 degrees Celsius, to fuse the dopant mixture, forming strong lattice structure and inter-particle bonding between the silicon quartz and the dopants.

The mixing process performed in box 304 thoroughly blends the quartz material with the dopant material. The mixing process allows the dopants to be uniformly distributed throughout the entire quartz material. Additionally, the process for mixing the dopants with the quartz material may include one or more thermal process cycles, e.g., first thermal melting the quartz material and followed by a thermal blending/mixing process, which allow bubbles present in the mixture to escape. Therefore, the resultant doped quartz material beneficially has reduced bubbles compared to conventionally processed quartz material. The amount and/or concentration of the dopants present in the quartz material may be varied in accordance with different process requirements.

In one embodiment, the dopant source may be a yttrium (Y) element selected from a group comprising of yttrium (Y) metal, yttrium alloy, yttrium oxide ($Y_2O_3$), yttrium-aluminum-garnet (YAG), and deviation thereof. Additionally, the dopant source may further include an aluminum containing material selected from a group consisting of aluminum (Al) metal, aluminum alloy, aluminum oxide ($Al_2O_3$), yttrium-aluminum-garnet (YAG), and aluminum nitride (AlN), among others. The dopant source may be doped into the quartz material between about 0.01 percent by weight and about 10 percent by weight, for example, about less than 5 percent by weight. In an exemplary embodiment depicted herein, the quartz material has less than about 5 percent by weight yttrium dopant and/or less than about 5 percent by weight aluminum containing dopants.

In box 305, a blank is formed from the blended material. The blanking process may include sintering, compression, molding or other forming process.

In box 306, the quartz material blank is machined or otherwise fabricated to form a component. For example, the quartz material blank may be machined to form a ring, such as the cover ring 102 in FIG. 2, for use in a plasma processing chamber. It is contemplated that the doped quartz material blank may be machined into different configurations for different uses in the plasma chamber, such as shields, windows, lids, rings and the like.

In box 308, an optional thermal treatment process is performed to treat the machined doped quartz component. The doped quartz component may be thermal treated by an improved thermal treatment process in accordance with one embodiment described in box 308 or by another suitable process. The thermal treatment process may be performed in an enclosure, such as a furnace or a chamber. In one embodiment, the thermal treatment process may be performed in the same enclosure where the doped quartz material was formed. Alternatively, the thermal treatment process may be performed in another enclosure. The thermal treatment process improves the surface finish of the doped quartz film, thereby providing a smooth surface and allowing tight fits with mating surfaces upon installation into the plasma chamber.

In an exemplary embodiment for the thermal treatment process, an annealing gas, e.g., nitrogen ($N_2$), is introduced into the enclosure up to a pressure in a range of about 100 mbar to about 1000 mbar. The temperature of the enclosure is ramped up from a first temperature, e.g., ambient temperature, to a second temperature, also referred to as the thermal treatment temperature. The thermal treatment temperature may be in a range of about 100 degrees Celsius (° C.) to about 500 degrees Celsius (° C.). The heating rate is selected to be sufficiently slow in order to minimize thermal stress in the doped quartz component and allow film lattice structure of the doped quartz component to be formed, thereby resulting in dense components with reduced surface roughness. For example, a heating rate in a range of about 20 to about 50 degrees Celsius per minute (° C./min.) is suitable for many applications. The component is maintained at the annealing temperature for a first time period, which may range from about 1 hour to about 5 hours.

The $N_2$ gas in the thermal treatment process nitrides the surface of the doped quartz material, repairing dangling bonds present on the surface of the doped quartz material. Alternatively, the thermal treatment process provided herein may also be utilized in conventional undoped quartz material. The nitrogen atoms are absorbed and incorporated into the silicon lattice to reduce surface defects. The amount of the nitrogen atoms incorporated into the doped quartz component may depend on the process temperature, nitrogen gas concentration, and overall process time performed in the thermal treatment process. For example, in embodiments where a high amount of nitrogen doping is desired, a higher nitrogen gas flow, higher temperature or longer process time may be used and vice versa. In an exemplary embodiment described herein, the nitrogen atoms incorporated into the doped quartz component is between about 10 parts per million (ppm) by weight and about 150 parts per million (ppm) by weight, for example, about 50 ppm by weight.

Alternatively, an inert gas and/or a reducing gas may be optionally supplied, concurrently or cyclically, with the $N_2$ gas into the enclosure during thermal treatment process. The inert gas and/or reducing gas may be concurrently supplied with the $N_2$ gas or periodically pulsed into and purged out of the enclosure during the thermal treatment process. In one embodiment, the reducing gas is a mixture of $N_2$ and $H_2$, for example, a forming gas with a concentration of $H_2$ of less than about 10 percent by volume, such as about 6 percent by volume. Other reducing gases may also be used, for example, $H_2$, $N_2/H_2$ mixture, $C_xH_yF_z$, $C_xF_z$, (where x, y and z are integers at least equal to 1), CO, $CO_2$, $NH_3$, $H_2/CO_2$ mixture, $CO/CO_2$ mixture, and $H_2/CO/CO_2$ mixture. Suitable examples of the inert gases include Ar, He, Ne, Kr and Xe.

As the thermal treatment process is completed, the temperature of the enclosure is ramped down over a time period of about 2 to about 50 hours to allow gradual cool of the treated doped quartz component to ambient temperature. The doped quartz component is cooled at a controlled rate to minimize thermal stress that might otherwise arise from an excessively fast cooling. For example, a cooling rate of about 20° C./min. to about 50° C./min. may be used. Alternatively, the optional thermal treatment process as shown in box 308 may be performed before the doped quartz material is machined into a component in box 306, as indicated by dashed line 310.

Comparative erosion tests have been conducted for several yttrium doped quartz components that were fabricated using embodiments of the present invention. The doped quartz parts tested were made from quartz material doped by yttrium under different conditions according to various embodiments of the present invention, and thermally treated according to one embodiment of the invention. Erosion (or corrosion) rates were obtained by performing thickness measurements on the parts before and after exposure to a reactive atmosphere, e.g., a fluorine-based plasma.

Results show that doped quartz component fabricated using embodiments of the invention exhibit improved erosion resistance, or reduced erosion rates, ranging from about 20 percent to about 35 percent, compared to a conventional quartz component fabricated using conventional processes.

In a particular embodiment, a doped quartz component has yttrium doping of about less than 5 percent by weight, an aluminum doping of less than about 5 percent by weight, and/or nitrogen doping about a concentration of 50 parts per million (ppm) by weight exhibits an improved erosion resistance, or reduced erosion rates, for exposure to a fluorine-containing plasma of about 30 percent as compared to conventional quartz components.

Figure 4A:
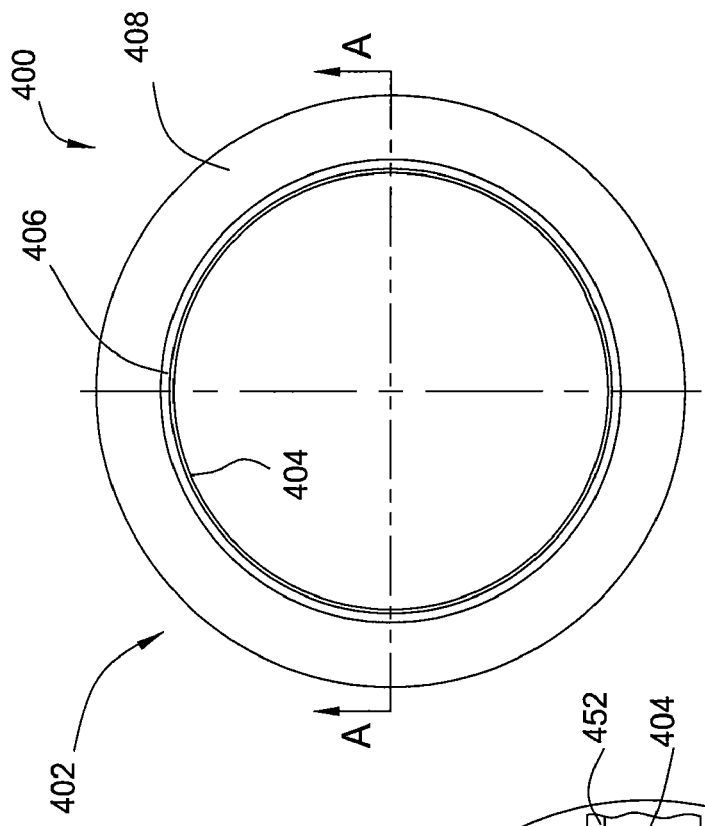
FIG. 4A depicts a top view of another embodiment of an exemplary cover ring suitable for use in the chamber of FIG. 1.
Figure 4B:
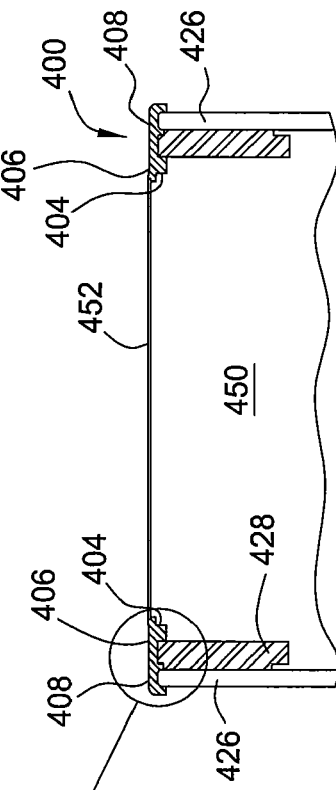
FIG. 4B depicts a schematic cross-sectional view of the cover ring of FIG. 4A disposed on a substrate support assembly.
Figure 4C:
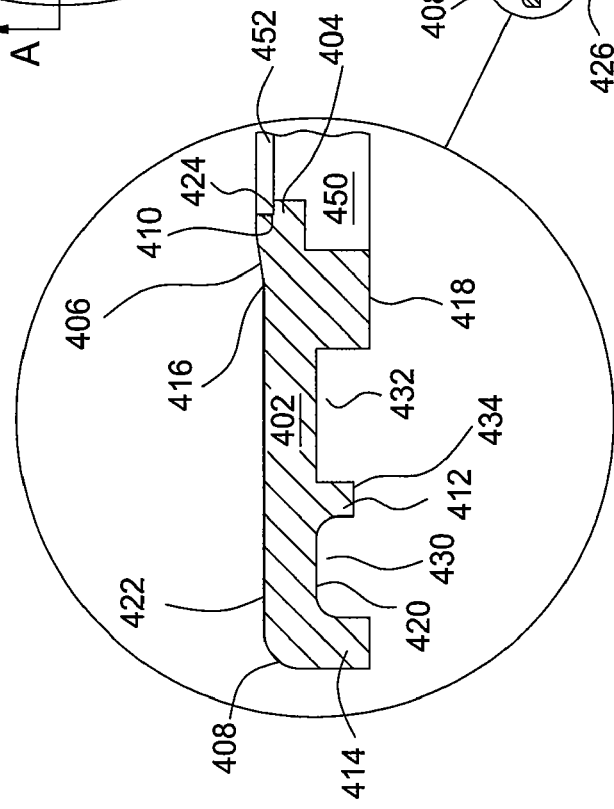
FIG. 4C depicts an enlarged view of the schematic cross-sectional view of FIG. 4B.

FIGS. 4A-C depicts schematic illustrations of another embodiment of an exemplary cover ring 400 disposed on a substrate support pedestal 450. FIG. 4A depicts a plan view of the cover ring 400. The cover ring 400 is fabricated from quartz material doped with yttrium element and/or aluminum, and in one embodiment, is fabricated by the method 300. The cover ring 400 has an annular body 402 having an outer region 408 and an inner region 406. A tab 404 of the inner region 406 extends radially inward from the body 402. In one embodiment, the cover ring 400 has an inner diameter between about 12 inches and about 13 inches, such as about 11.7 inches, and an outer diameter about 15 inches and about 16.5 inches, such as about 15.9 inches.

FIG. 4B depict a cross sectional view of the cover ring 400 taken along section line A-A disposed around the pedestal 450 and a substrate 452. The cover ring 400 covers the outer upper surface of the pedestal 450 and caps an insulator ring 428 circumscribing the pedestal 450. In one embodiment, the cover ring 400 may be used along, or in combination with the insulator ring 428 for providing a good seal between the mating surfaces of the pedestal 450. The cover ring 400 is interleaved with an upper end of a chamber component 426, such as a chamber liner, engaged with the pedestal 450.

FIG. 4C depicts an enlarged view of a portion of the cover ring 400. The annular body 402 of the cover ring 400 generally has an upper surface 422 and a bottom surface 420. A first ridge 414, a second ridge 412, and a third ridge 418 extending downward from the bottom surface 420 of the body 402. In the embodiment depicted in FIG. 4C, the ridges 414, 412, 418 are concentric rings.

The first and the second ridges 414, 412 extend from the inner portion of the cover ring 400, and define a first slot 430 therebetween that captures the upper end of the chamber component 426. The first ridge 414 extends further from the body 402 than the second ridge 412. The second ridge 412 and the third ridge 418 define a second slot 432 that captures an upper surface of the insular ring 428 engaged with the pedestal 450, thereby fixing the orientation between the cover ring 400 and the pedestal 116. The second ridge 412 has a lower surface 434. A width of the lower surface 434 is identical to a width of the upper surface of the insulator ring 428, thereby providing a good occlusion between two components, which will be further described below with reference to FIGS. 5A-B.

The tab 404 includes an upper surface 424 that is substantially coplanar with an upper surface of the pedestal 116, thereby allowing the substrate 452 to cover the interface between the upper pedestal surface and the upper surface 424 of the tab 404 when the substrate 452 is disposed thereon.

An inner wall 410 is disposed between the tab 404 and the upper surface 424 of the body 42. The inner wall 410 has a diameter greater than the inside diameter of the tab 404. The upper surface 422 of the body 402 includes the inner region 406 and the outer region 408, as shown in top view of FIG. 4A. The inner region 406 is raised relative to the outer region 408. The inner region 406 may be orientated parallel to the outer region 408 of the upper surface 424. A sloped region 416 defines a transition region between the inner and outer region 406, 408 of the upper surface 422.

In one embodiment, the cover ring 400 is a yttrium doped quartz ring manufactured by the method 300 of FIG. 3. In another embodiment, the cover ring 400 is a yttrium and aluminum doped quartz ring. In yet another embodiment, the cover ring 400 is a yttrium, aluminum and nitrogen containing ring.

FIGS. 5A-B depict schematic illustrations of an embodiment of an exemplary insulator ring 428 that may be used along, or in combination with the cover ring 400 of FIGS. 4A-C, in the substrate pedestal 450, or other pedestal. The insulator ring 428 may be manufactured by the method 300 of FIG. 3. Alternatively, the insulator ring 428 may be manufactured by any suitable techniques.

FIG. 5A depicts a plan view of the insulator ring 428. The insulator ring 428 has an outer region 502 and an inner region 504. The inner region 504 of the ring 428 is adapted to engage in the slot 432 defined between the second and third ridge 412, 418 of the cover ring 400, as shown in FIG. 4B.

FIG. 5B depicts a cross sectional view of the insulator ring 428 taken along section line A-A of FIG. 5A. As the insulator ring 428 is capped by the cover ring 400, the insulator ring 428 is not in direct contact with the substrate 452. A recessed portion 506 is formed on the upper corner and lower corner of the outer region 502. The recessed portion 506 formed on the upper corner of the outer region 502 receives the second ridge 412 of the cover ring and mates with the lower surface 434 of the second ridge 412. The recessed portion 506 capes the second ridge 412, providing a good seal and fixing the orientation of the cover ring 400.

In one embodiment, the insulator ring 428 may be a conventional quartz ring. In another embodiment, the insulator ring 428 may be a yttrium doped quartz ring, a yttrium and aluminum doped quartz ring or a yttrium, aluminum and nitrogen containing ring. In still another embodiment, the ring 428 may be manufactured by the method 300 in FIG. 3.

Doped quartz components, such as the cover ring 102 of FIG. 1-2A-D, the cover ring 400 of FIG. 4A-C and the insular ring 428 of FIGS. 4B and 5A-B are found to have improved characteristics such as morphology and microstructure, resulting in enhanced resistance to corrosion by plasma gases, reduced mechanical stress, improved surface finish, and reduced particle generation.

Although the examples and discussions above illustratively focus on a doped quartz component for plasma chambers, one or more embodiments of the invention can also be utilized for other chamber components, including components using a variety of materials for different applications. For example, the thermal treatment process of the present invention may also be applied to parts made of materials such as ceramics, metals, dielectrics, alloys, and so on.

While the foregoing is directed to embodiments of the present invention, other and further embodiments of the invention may be devised without departing from the basic scope thereof, and the scope thereof is determined by the claims that follow.

What is claimed is:

1. A doped quartz component for use in a plasma chamber, comprising:
    a yttrium doped machined quartz ring configured to support a substrate, wherein the quartz ring further comprises a post-machining thermally applied nitrogen containing dopant.

2. The doped quartz component of claim 1, wherein the yttrium dopant comprises about less than 5 percent by weight.

3. The doped quartz component of claim 2, wherein the yttrium dopant is at least one of yttrium metal, yttrium alloy, or yttrium oxide.

4. The doped quartz component of claim 1, wherein the quartz ring further comprises aluminum containing dopant.

5. The doped quartz component of claim 4, wherein the aluminum containing dopant is at least one of aluminum metal, aluminum alloy, aluminum oxide or aluminum nitride.

6. The doped quartz component of claim 4, wherein the aluminum containing dopant comprises about less than 5 percent by weight.

7. The doped quartz component of claim 1, wherein the nitrogen dopant comprises between about 10 ppm by weight and about 150 ppm by weight.

8. The doped quartz component of claim 1, wherein the quartz component has an outer perimeter, an inner perimeter, and a recessed portion adjacent the inner perimeter configured to receive the substrate.

9. The doped quartz component of claim 1, wherein the quartz component has an outer region, an inner region, and a recessed portion formed in the outer region.

10. A doped quartz component for use in a plasma chamber, comprising:
    a machined quartz ring having an annular body adapted to circumscribe a substrate support pedestal and comprised of a material suitable for exposure to a corrosive plasma environment, wherein the quartz ring comprises nitrogen, yttrium and aluminum dopants, the yttrium and aluminum dopant having less than about 5 percent by weight respectively, the nitrogen containing dopant applied by a post-machining thermal treatment process on the formed quartz ring.

11. The doped quartz component of claim 10, wherein the nitrogen dopants is between about 10 ppm by weight and about 150 ppm by weight.

12. The doped quartz component of claim 10, wherein the yttrium dopant is at least one of yttrium metal, yttrium alloy, and yttrium oxide, or the aluminum dopant is at least one of aluminum metal, aluminum alloy, aluminum oxide, or aluminum nitride.

* * * * *